(12) United States Patent
Schmidt et al.

(10) Patent No.: US 10,969,441 B2
(45) Date of Patent: Apr. 6, 2021

(54) ILLUMINATION APPARATUS AND HEADLAMP

(71) Applicant: OSRAM GmbH, Munich (DE)

(72) Inventors: Ingo Schmidt, Zeuthen (DE); Melanie Zumkley, Berlin (DE); Daniel Vogel, Berlin (DE)

(73) Assignee: OSRAM GmbH, Munich (DE)

( * ) Notice: Subject to any disclaimer, the term of this patent is extended or adjusted under 35 U.S.C. 154(b) by 185 days.

(21) Appl. No.: 16/030,881

(22) Filed: Jul. 10, 2018

(65) Prior Publication Data
US 2019/0033399 A1 Jan. 31, 2019

(30) Foreign Application Priority Data
Jul. 27, 2017 (DE) ...................... 10 2017 212 964.6

(51) Int. Cl.
*G01R 31/44* (2020.01)
*F21S 41/16* (2018.01)
*F21S 41/176* (2018.01)

(52) U.S. Cl.
CPC .............. *G01R 31/44* (2013.01); *F21S 41/16* (2018.01); *F21S 41/176* (2018.01)

(58) Field of Classification Search
CPC ................................ G01R 31/44; F21S 41/176
USPC .................................................. 324/414, 750
See application file for complete search history.

(56) References Cited

U.S. PATENT DOCUMENTS

| | | | | |
|---|---|---|---|---|
| 2011/0249120 | A1* | 10/2011 | Bingle | B60R 11/04 348/148 |
| 2014/0009952 | A1* | 1/2014 | Nomura | F21S 41/16 362/509 |
| 2014/0125578 | A1* | 5/2014 | Zhou | G09G 3/20 345/156 |
| 2014/0334167 | A1* | 11/2014 | Tiefenbacher | F21S 45/10 362/465 |
| 2018/0119897 | A1* | 5/2018 | Vogt | F21V 9/32 |

FOREIGN PATENT DOCUMENTS

| | | |
|---|---|---|
| DE | 102015212460 A1 | 1/2017 |
| DE | 102015213460 A1 | 1/2017 |
| DE | 202017100639 U1 | 3/2017 |
| FR | 2321233 A7 * | 3/1977 ........... H05K 3/3447 |

OTHER PUBLICATIONS

Espacent Translate FR2321233A7 (Year: 1977).*
German Search Report based on application No. 10 2017 212 964.6 (7 pages) dated Mar. 20, 2018 (for reference purpose only).

* cited by examiner

*Primary Examiner* — Melissa J Koval
*Assistant Examiner* — Courtney G McDonnough

(57) ABSTRACT

In various embodiments, an illumination apparatus is provided. The illumination apparatus includes a housing, in which at least one radiation source is fixed. A phosphor that is fastened to the housing is arranged downstream of the radiation source. The phosphor is connected to a crack detector, which is used for crack monitoring of the phosphor. A signal path is provided. The signal path connects the crack detector to an evaluation unit that is fixed to the housing. The signal path is formed by at least two contact pins and a flexible printed circuit board that is connected to the crack detector.

11 Claims, 3 Drawing Sheets

ILLUMINATION APPARATUS AND HEADLAMP

This application claims priority to German Patent Application Serial No. 10 2017 212 964.6, which was filed Jul. 27, 2017, and is incorporated herein by reference in its entirety.

TECHNICAL FIELD

Various embodiments relate generally to an illumination apparatus. Various embodiments furthermore relate to a headlamp having an illumination apparatus.

BACKGROUND

Conventional headlamps use LARP (laser-activated remote phosphor) technology. In this technology, a conversion element that is arranged at a distance from a radiation source and has, or consists of, a phosphor is irradiated by excitation radiation, in particular an excitation beam or pump beam or pump laser beam, in particular by the excitation beam of a laser diode. The excitation radiation is at least partly absorbed by the phosphor and at least partly converted into conversion radiation or into conversion light, the wavelengths of which and hence the spectral properties and/or color of which are determined by the conversion properties of the phosphor. In the case of down conversion, the excitation radiation of the radiation source is converted by the irradiated phosphor into conversion radiation having longer wavelengths than the excitation radiation. By way of example, this allows the conversion element to convert blue excitation radiation, in particular blue laser light, into red and/or green and/or yellow conversion radiation. In the case of a partial conversion, white used light is produced, for example, from a superposition of non-converted blue excitation light and yellow conversion light.

A headlamp with LARP technology has, for example, an illumination apparatus with a housing. Arranged in the latter can be the laser diode. Provided between the laser diode and a housing opening can then be a substrate having a phosphor that is able to be irradiated by the excitation radiation. In order to detect cracking in the phosphor, a crack detector is arranged. Said crack detector has an electrically conductive track that is arranged on the phosphor. The conductive track is connected here, via a flexible printed circuit board, to an electronic evaluation unit, by way of which in particular a change in resistance in the conductive track due to a crack in the phosphor is detectable. The flexible printed circuit board is here typically at least sectionally guided outside the housing for easier assembly.

A disadvantage of the abovementioned solution is that the production of the illumination apparatus with the crack detector is complicated in terms of apparatus and cannot be effected by way of a process-reliable automatic assembly. In particular due to the flexible printed circuit board, protection against electrostatic discharge that can result in damage to the illumination apparatus is possible only in a complicated way, for example with a plastic cover of the housing. Electromagnetic compatibility, i.e. resistance with respect to electromagnetic disturbances and low emitted interference, cannot be achieved, or achieved only with significant outlay, in a solution of this type.

SUMMARY

In various embodiments, an illumination apparatus is provided. The illumination apparatus includes a housing, in which at least one radiation source is fixed. A phosphor that is fastened to the housing is arranged downstream of the radiation source. The phosphor is connected to a crack detector, which is used for crack monitoring of the phosphor. A signal path is provided. The signal path connects the crack detector to an evaluation unit that is fixed to the housing. The signal path is formed by at least two contact pins and a flexible printed circuit board that is connected to the crack detector.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
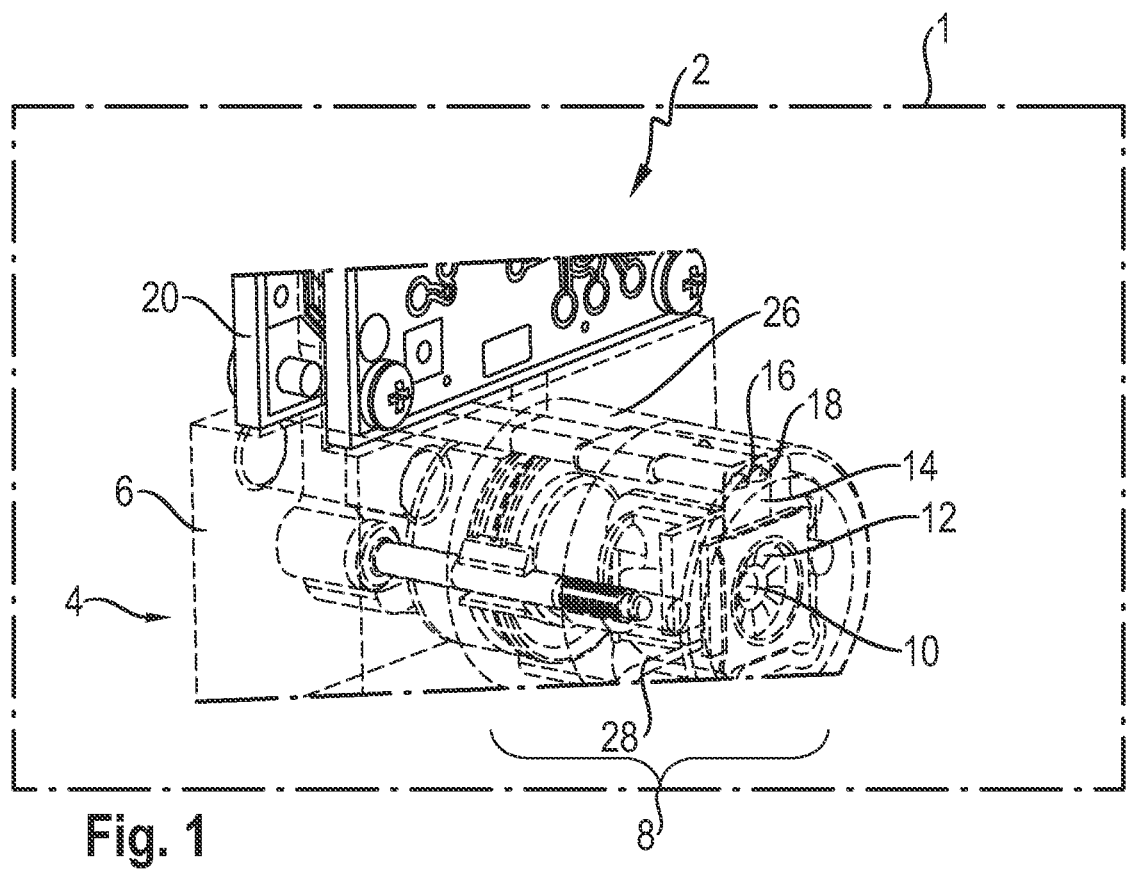
FIG. 1 shows a perspective illustration of a detail of an illumination apparatus in accordance with an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various embodiments provide an illumination apparatus and a headlamp that are easily and cost-effectively producible.

Provided in accordance with various embodiments is an illumination apparatus, e.g. with a LARP (laser-activated remote phosphor) system or a μ-LARP system. Said illumination apparatus can have a housing, in which at least one radiation source, e.g. a laser diode which emits for example blue radiation, is arranged. Connected downstream of the radiation source is then a phosphor, which is attached to the housing. The phosphor can be connected to a crack detector or a sensor unit, which is used for fracture or crack monitoring of the phosphor. The crack detector can then be connected to an evaluation unit arranged at the housing by a signal path or current path. In various embodiments, the signal path is formed by at least two, e.g. flexurally rigid or stiff or solid, contact pins and a flexible or flexurally non-rigid printed circuit board that is connected to the crack detector. The printed circuit board can then be electrically and mechanically connected to the evaluation unit via the contact pins.

This solution may have the effect that the connection between the crack detector and the evaluation unit, is made firstly via a flexible printed circuit board and secondly via mechanically stiff contact pins, rather than via one or more flexible printed circuit boards alone. The contact pins are process-reliably mountable in a manner in which they are easier to handle as compared to a flexible printed circuit board. They can then be provided for the reliable transmission of a signal of the crack detector to the evaluation unit. The contact pins are consequently not directly connected to the crack detector, but via the flexible printed circuit board so as to compensate for mounting tolerances. By way of example, the contact pins can be at least pre-assembled with the evaluation unit and/or the flexible printed circuit board simply via a plug connection. Process-reliable automatic plug-in assembly is thus made possible.

In a further configuration of various embodiments, the contact pins can be sheathed in a manner which is simple in terms of apparatus by an electrically non-conductive or insulating cladding. The contact pins are furthermore e.g. arranged within the housing. The combination of cladding and arrangement within the housing results in safety with respect to an electrostatic discharge (ESD safety) being ensured in a manner which is simple in terms of apparatus. This combination of cladding and arrangement within the housing furthermore results in interference immunity and consequently lower emitted interference with respect to electromagnetic waves (EMC compatibility). The evaluation unit preferably has a stiff or solid or flexurally rigid printed circuit board to which the contact pins can be fixedly connected. This results in a high stiffness and robust configuration of the illumination apparatus. The stiff printed circuit board is preferably secured to the housing. In this case, it can be arranged entirely or at least partially within the housing. As a result, at least one printed circuit board section having receptacles for the contact pins is provided within the housing. The contact pins therefore do not have to be guided out of the housing through the printed circuit board section within the housing in order to connect to the stiff printed circuit board.

The contact pins may have a common cladding and in that case can form a common connecting part. This is easier to handle than two separate contact pins. The cladding is formed for example from plastics and can be produced by a plastics injection molding method and can hereby then peripherally surround the contact pins.

The housing may be formed at least substantially from metal. It can have a main section, in which the radiation source and/or the evaluation unit is/are arranged. A socket-shaped or pipe-shaped housing section can then extend from the main section. Fixed to the former at the end, or with a distance from the main section, can then be the phosphor which in that case may be arranged within the housing section. Radiation emitted by the radiation source can then be incident, via the housing section, on the phosphor, while radiation exiting the phosphor can then exit to the outside via a housing opening which is formed at the housing section, e.g. at the end.

In a further configuration of various embodiments, provision may be made for a slot for receiving the contact pins to be formed within the housing section. Hereby, the contact pins can easily be mounted by being inserted into the slot, e.g. in a form-fitting manner, while also being easy to position. The slot can here peripherally enclose for example the contact pins and thus results in an improved ESD safety and EMC compatibility. The slot may end in or merges with the main section, wherein the contact pins which have been inserted into the slot can then project into the main section via the slot so as to be able to be connected to the stiff printed circuit board.

The housing section, which adjoins the main section of the housing or projects away from it, may have a main body which extends away from the main section. Furthermore, the housing section can have, at its end, a housing head which then terminates the main body and can consequently form a type of cover. The housing opening is then preferably provided within the housing head. It is feasible to form the slot at the main body and to then cover it by way of the housing head. In this way, the contact pins can, when the housing head is detached, simply be inserted into the slot toward the stiff printed circuit board in a manner which is simple in terms of apparatus, wherein then, after the contact pins have been mounted, the housing head can close the slot. The housing head is connected to the main body preferably via a screw connection. The contact pins can furthermore project into the housing head, proceeding from the slot, and be connected at the end to the flexible printed circuit board, in particular within the housing head. The housing section has, for example, a circular-cylindrical outer cover surface.

In a further configuration of various embodiments, provision may be made for at least one support surface or preferably two support surfaces to be formed at the cladding of the contact pins. Via said support surfaces, the contact pins can then be supported at the housing against displacement toward the stiff printed circuit board and/or against displacement toward the flexible printed circuit board. As a consequence, the contact pins are able to be positioned uniquely. Provided in the slot can then be a stop for at least one supporting surface, e.g. for the supporting surface which delimits displacement of the contact pins toward the stiff printed circuit board. Alternatively or additionally provided at the housing head can be a stop for the supporting surface, e.g. for the supporting surface which delimits displacement of the contact pins toward the flexible printed circuit board. Consequently, unique location of the contact pins can be ensured via the slot and the stop in the slot. In the final assembly process, a degree of freedom toward the flexible printed circuit board or in the beam direction of the radiation source can be delimited by the stop which is formed on the housing head. If no stop were provided in the housing head, then, in the case of a displacement of the contact pins toward the housing head, for example during mounting, a short circuit could occur, for example if the contact pins came into contact with the housing head. The support surfaces may be formed at an, e.g. radial, broadening of the cladding. The support surface or the support surfaces can extend approximately transversely to the contact pins.

The contact pins may be formed from metal. Consequently, the connector can consist of two metal pins, around which a plastic material has been molded.

Provision may furthermore be made for the contact pins to have a technical coating, e.g. with respect to corrosion protection and/or with respect to improved heat dissipation. It is thus possible, in a simple manner, to exert an influence on positive properties with respect to the contact pins. As a technical coating, e.g. a gold coating is provided, which serves for the process-reliable connection, for example soldering, of the pins to the printed circuit boards and additionally also makes a contribution to an improved corrosion protection and improved heat dissipation.

The contact pins can project from their cladding on both sides, that is to say in each case by their two end sections. The contact pins may extend with a parallel distance from one another. In various embodiments, the contact pins can extend adjacent to one another and along a radiation path between the radiation source and the phosphor. An extremely short connection between the main section, at which e.g. the evaluation unit is provided, and the crack detector, which is provided at the end side of the housing section, is thus made possible. By way of example, the contact pins extend, e.g. approximately, with a parallel distance with respect to the longitudinal axis of the housing section. The longitudinal axis can then be arranged, e.g. approximately, parallel with respect to the optical main axis of the illumination apparatus.

In various embodiments, the contact pins are soldered or adhesively bonded to the flexible printed circuit board in a manner which is simple in terms of apparatus. Alternatively or additionally, provision may be made for the contact pins to be soldered or adhesively bonded to the stiff printed circuit board in a manner which is simple in terms of apparatus. Consequently, the contact pins can be inserted simply in a pre-assembly step into the stiff printed circuit board and subsequently be connected thereto via an integral bond. The same can be provided with respect to the flexible printed circuit board. If an adhesive bond is provided, an electrically conductive adhesive or adhesive substance can be used. Due to the flexibility of the flexible printed circuit board, stresses exerted on the connection, e.g. on the adhesive bond, which can occur for example due to a thermal length change of the contact pins, are minimized.

In various embodiments, the phosphor can be fixed to the housing via an, e.g. transparent, substrate. The substrate then extends, for example, e.g. approximately, transversely to the optical main axis or longitudinal axis of the housing section.

The phosphor can at least partially convert incident primary light to secondary light of a different wavelength. If a plurality of phosphors are present, these can produce secondary light of mutually different wavelengths. The wavelength of the secondary light may be longer (so-called "down conversion") or shorter (so-called "up conversion") than the wavelength of the primary light. For example, blue primary light can be converted to green, yellow, orange or red secondary light using a phosphor. In the case of an only partial wavelength conversion, a mixture of secondary light and non-converted primary light is emitted by the base body, which can serve as used light. For example, useful white light can be produced from a mixture of blue, non-converted primary light and yellow secondary light. However, full conversion is also possible, in which case the used light is either no longer present in the used light, or is present only as a negligible portion. A degree of conversion depends, for example, on a thickness and/or a phosphor concentration of the base body. If a plurality of phosphors are present, secondary light components of different spectral compositions can be produced from the primary light, e.g. yellow and red secondary light. The red secondary light may be used, for example, to give the used light a warmer hue, e.g. "warm white." If a plurality of phosphors are present, at least one phosphor may be suitable for wavelength-converting secondary light again, e.g. green secondary light to red secondary light. Such light that has been wavelength-converted again from a secondary light may also be referred to as "tertiary light." The phosphor is consequently located in the optical main axis. For example, the phosphor is arranged on a side of the substrate that faces away from the radiation source.

The crack detector may have at least one conductive track or one conductor path or one conductor wire, which is arranged on an input coupling side or an output coupling side of the phosphor or within the phosphor. For further information with respect to possible embodiments and mode of operation of the crack detector, reference is made, for example, to document DE 10 2015 212 460. If the phosphor is cracked, the conductive track, which is fixedly connected to the phosphor, is likewise mechanically stressed and can also tear. The mechanical stress or damage to the conductive track can then be detected with the electrical evaluation device, wherein it is consequently possible to deduce damage to the phosphor from the damage to or stress on the conductive track.

A conductive track is in particular understood to mean a practically one-dimensionally extended electrical line, which means that a longitudinal extent of the line is significantly greater (e.g. by at least a factor 2, e.g. by at least one order of magnitude) than a width and a height. The conductive track can be, e.g., a wire which has been incorporated into the base body, or a conductor path, which is applied on the surface of the base body.

However, the conductive track can in principle have any desired shape and be generally also referred to as a conductive area. This is true e.g. if a location at which a crack may possibly form in the future is well known.

In a further configuration of the invention, it is feasible for two or more conductive tracks to be provided. Consequently, it is possible for a conductive track to be provided at the input coupling side and for a conductive track to be provided at the output coupling side. It is also feasible that a conductive track is provided at the input coupling side or output coupling side, and that a further conductive track is provided in the phosphor. If at least three conductive tracks are provided, one can be provided at the input coupling side, one at the output coupling side and one in the phosphor. In various embodiments, two contact pins are provided for a respective conductive track. If four or six or eight etc. contact pins are arranged, they can be sheathed by a common cladding, or for example in each case two contact pins have a common cladding.

In various embodiments, the conductor loop is formed on a surface of the phosphor and has the shape of a meander, wherein at least one partial loop of the meander completely extends around a circular conversion region of the phosphor. Provision is generally made here for the conductor loop to return after one turn along a similar path. Such a configuration of the conductor loop ensures that it is generally not possible for a crack to run over the conversion region from the inside to the outside without severing the conductor loop at least once.

The conductor track is connected to the flexible printed circuit board via two contact surfaces, which are situated on the substrate, e.g. on a side that faces away from the radiation source.

The flexible printed circuit board may be connected to the crack detector via an electrically conductive adhesive in a manner which is simple in terms of apparatus. It is feasible for the flexible printed circuit board to be connected to the substrate, e.g. by an integral bond, for example by way of the adhesive. The printed circuit board can furthermore have a through-opening, which allows radiation to pass through. The flexible printed circuit board extends, for example, transversely to the housing section or approximately transversely to the optical main axis.

In various embodiments, at least one contact pin exhibits, or the contact pins exhibit, e.g. together with the cladding, at least one offset or bend or step. In a manner which is simple in terms of apparatus, this leads to the contact pins being sheathed by the cladding in a form-fitting manner, as compared to straight contact pins, as a result of which axial displacement of the contact pins in the cladding can be avoided. In other words, a limitation of position tolerances of the contact pins is made possible by way of a form-fitting location.

The contact pins may be, e.g. together with the cladding, offset in the direction of the flexible printed circuit board. Consequently, the contact pins are guided closer at the end side to the crack detector, as a result of which the flexible printed circuit board, which is provided between the crack detector and the contact pins, can in turn be made smaller. By guiding the contact pins toward the crack detector, additional installation space is furthermore provided in the offset region of the contact pins radially outwardly at the housing section.

In various embodiments, the main body of the housing section can be set back radially at its end section that faces away from the main section. Hereby, for example a free space for the offset section of the contact pins and the cladding can be formed. The set-back end section has, for example, a groove, which is open radially outwardly, for receiving the offset section of the contact pins and the cladding.

According to various embodiments, a headlamp having an illumination apparatus in accordance with one or more of the preceding aspects is provided. The headlamp may be used in the automotive sector, e.g. in a vehicle.

Further areas of use can be, for example, lamps for effect lighting, entertainment lighting, architainment lighting, ambient lighting, medical and therapeutic illumination, lighting for horticulture etc.

The vehicle can be an aircraft or a watercraft or a land vehicle. The land vehicle can be a motor vehicle or a rail vehicle or a bicycle. In various embodiments, the vehicle is a truck or a passenger car or a motorcycle. The vehicle can furthermore be configured as a non-autonomous or partially autonomous or autonomous vehicle.

FIG. 1 here shows, simplified with a dashed line, a headlamp 1. The latter has an illumination apparatus 2. Said illumination apparatus has a housing 4 with a main section 6 and a housing section 8. The housing section 8 is formed approximately with a circular-cylindrical outer cover surface and projects away from the main section 6. Arranged within the housing 4 is a radiation source in the form of a blue laser diode. Excitation radiation can be emitted by said laser diode into the housing section 8. At the end within the housing section 8, a phosphor 10 is provided. The excitation radiation emitted by the laser diode can then be at least partially or completely converted to conversion radiation via said phosphor and exit the housing section 8 axially via a housing opening, wherein the exit, in the case of partial conversion, takes place at the same time as the exit of non-converted excitation radiation. Any possible cracking of the phosphor 10 is detected by a crack detector 12 arranged in the housing section 8. Said detector is electrically connected to an evaluation unit having a stiff printed circuit board 20 via a flexible printed circuit board 14 and two contact pins 16, 18. The printed circuit boards 14 and 20 can here extend, e.g. approximately, parallel at a distance from one another, wherein the contact pins 16, 18 can be arranged, e.g. approximately, perpendicular to the printed circuit boards 14, 20. The printed circuit board 20 is here secured to the housing section 6 of the housing 4 and, in accordance with FIG. 2, projects into the housing 4 by way of a printed circuit board section 22.

Figure 2:
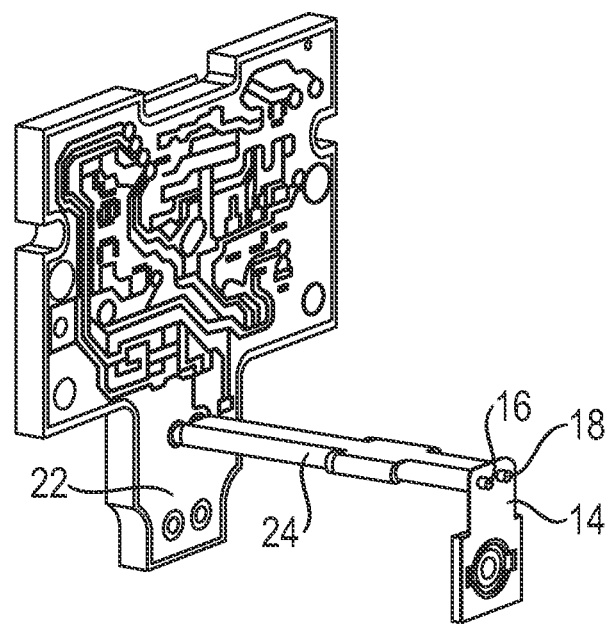
FIG. 2 shows a perspective illustration of a crack detector having an evaluation unit for a phosphor of the illumination apparatus from FIG. 1.

FIG. 2 shows that the contact pins 16, 18 are sheathed together by a cladding 24 made of plastic. The cladding 24 is molded around the contact pins 16, 18 e.g. in a plastic injection molding process. The contact pins 16, 18 are connected by way of their end sections, which project from the cladding 24, firstly to the stiff printed circuit board 22 and secondly to the flexible printed circuit board 14.

Figure 3:
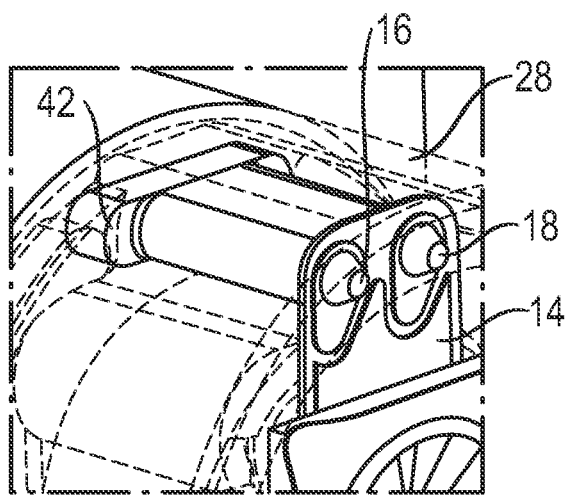
FIGS. 3 and 4 show respectively show a perspective illustration of a detail of the illumination apparatus.

According to FIG. 3, the contact pins 16, 18 pass through the flexible printed circuit board 14 and are soldered thereto on a side that is remote from the radiation source by way of a solder connection.

Figure 4:
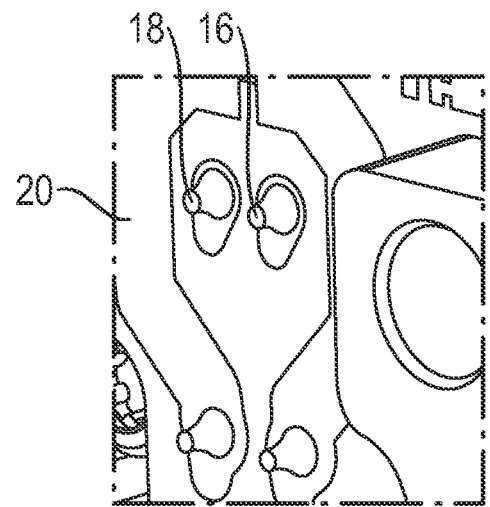

FIG. 4 shows that the contact pins 16, 18 pass through the stiff printed circuit board 20 and are soldered thereto on the side that is remote from the flexible printed circuit board 14.

According to FIG. 1, the housing section 8 has a main body 26 and, at its end, a housing head 28.

Figure 5:
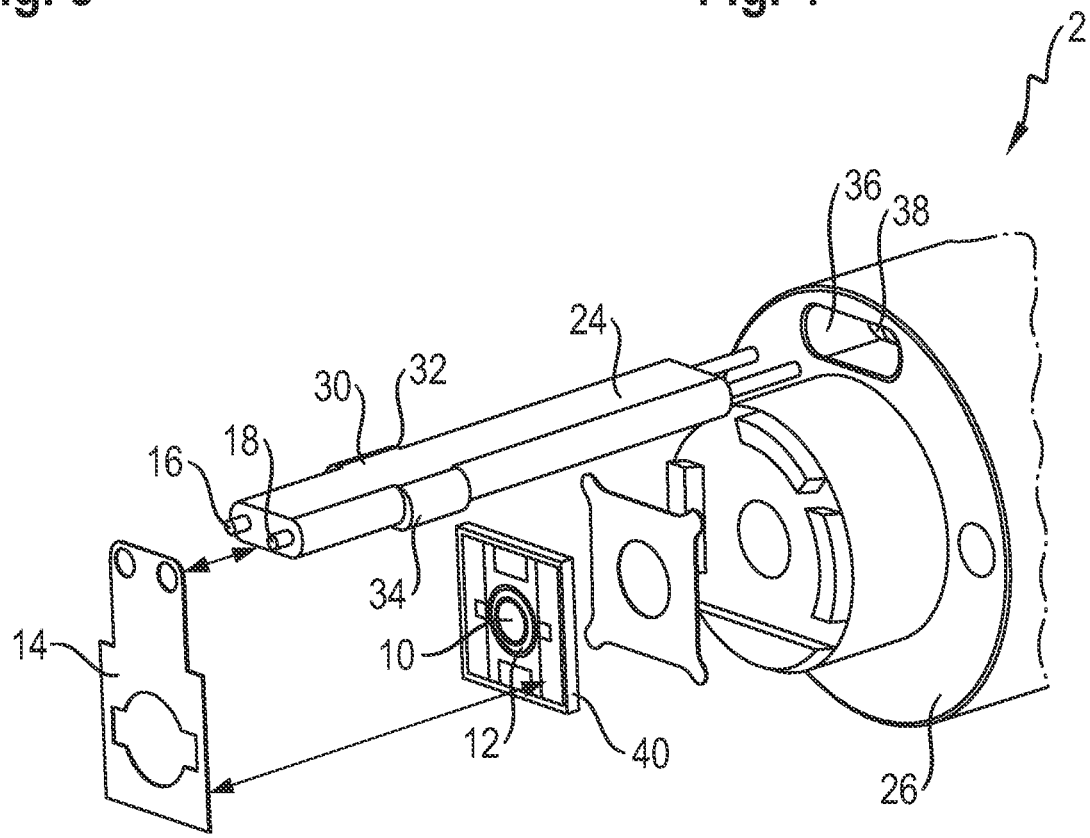
FIG. 5 shows an exploded view of a section of the illumination apparatus from FIG. 1 in the region of the crack detector.

According to FIG. 5, the illumination apparatus 2 is shown in the region of the main body 26, wherein the housing head 28, see FIG. 1, cannot be seen. FIG. 5 shows that the contact pins 16, 18, together with the cladding 24, form a flexurally rigid connector. The cladding 24 has a cylindrical design and has a broad section 30. Formed thereon are two support surfaces 32, which face toward the main body 26 or toward the main section 6, see FIG. 1, and one of which is provided with a reference sign. Furthermore provided are two support surfaces 34, which face in the opposite direction, i.e. away from the main section, wherein one of which is provided with a reference sign. A slot 36 is furthermore formed within the main body 26 for the cladding 24 with the contact pins 16, 18. Said slot extends starting from a front side of the main body 26 and ending in the main section 6. Provided in the slot 36 is a stop 38, on which the support surfaces 32 are able to come to rest. An immersion depth of the contact pins 16, 18 into the slot 36 can hereby be delimited, which results in a simplified assembly.

FIG. 5 furthermore illustrates the phosphor 10, which is fixed to a substrate 40. The crack detector 12 is then also arranged on the substrate 40 and the phosphor. The crack detector 12 is then electrically connected to the flexible printed circuit board 14.

In the assembled state of the illumination apparatus 2, the support surfaces 34 from FIG. 5 are supported on the housing head 28, see FIG. 3. To this end, the housing head 28 has a stop 42.

Figure 6:
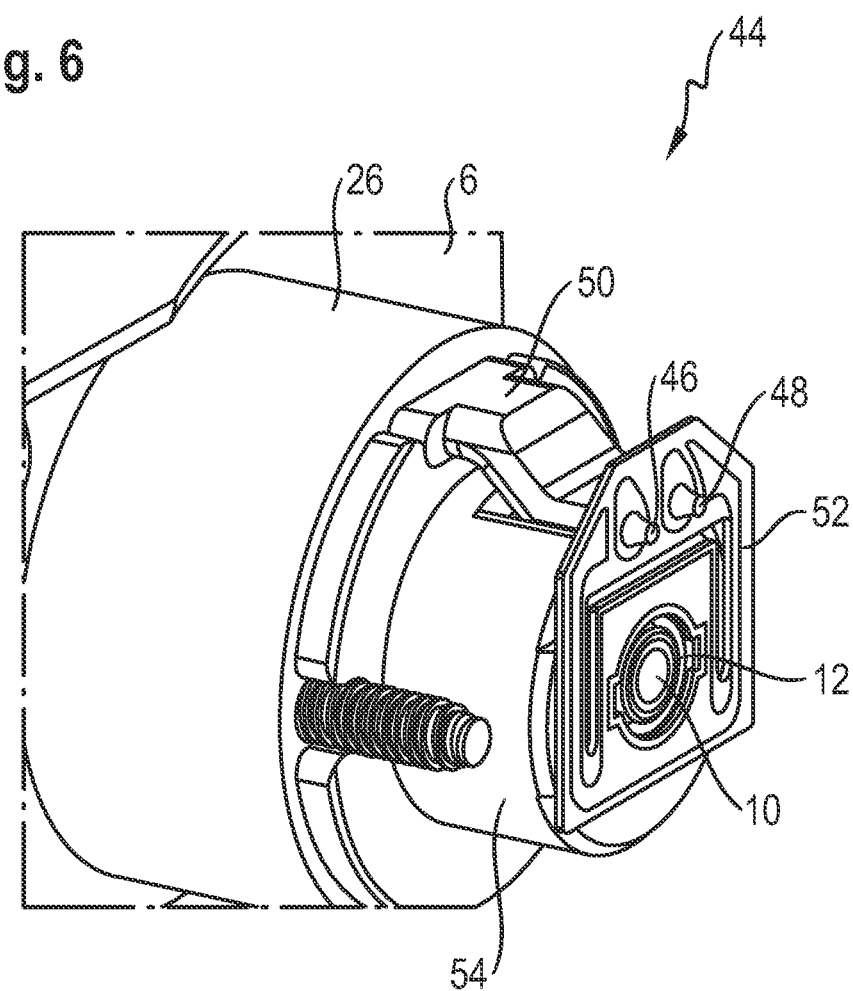
FIG. 6 shows a perspective illustration of a detail of an illumination apparatus in a region of the crack detector in accordance with a second embodiment in the disassembled state.

FIG. 6 illustrates parts of an illumination apparatus 44 in accordance with a further embodiment. Here, in contrast to the previous embodiment, provision is made for the contact pins 46, 48 and their cladding 50 to be offset. Here, the contact pins 46, 48 extend, in accordance with FIG. 1, starting from the stiff printed circuit board 22, wherein they are then approximately radially offset toward the inside in the end region of the main body 26. In a side view, they here form in each case approximately a step shape. Consequently, the end region of the contact pins 46, 48, which is provided at the side of the flexible printed circuit board 14, and the cladding 50 are offset toward the inside, wherein the contact pins 46, 48 at their ends once more extend with a parallel distance from their sections that are provided at the side of the stiff printed circuit board 20. Due to the offset, a distance from the phosphor 10 and from the crack detector 12 is reduced, which is why a flexible printed circuit board 52 can have a smaller configuration in the radial direction.

Figure 7:
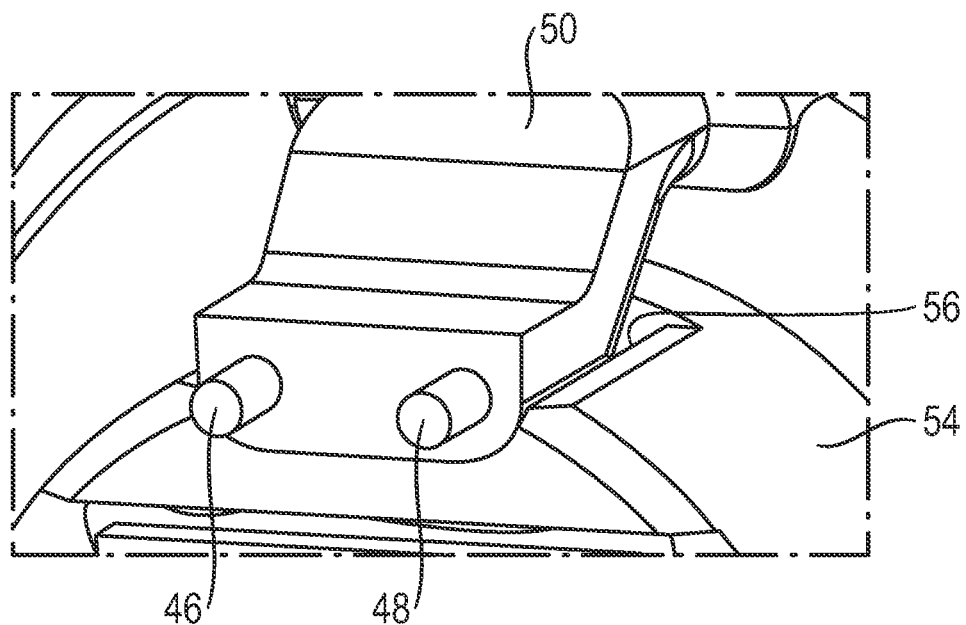
FIG. 7 shows a perspective illustration of a detail of the illumination apparatus in accordance with the second embodiment.

FIG. 6 furthermore shows that the main body 26 has an end section 54 which is radially set back. According to FIG. 7, formed in the end section 54 is a groove 56, which is formed radially outwardly and away from the main section 6 in the axial direction, for the form-fitting reception of the offset section of the contact pins 46, 48 and the cladding 50.

Disclosed is an illumination apparatus with a LARP (laser-activated remote phosphor) system. Said apparatus has a radiation source, with a phosphor being connected downstream thereof, wherein the radiation source and the phosphor are arranged in a housing. To monitor cracking, a crack detector is provided at the phosphor. The crack detector is here connected to an electronic evaluation unit provided at the housing via contact pins.

LIST OF REFERENCE SIGNS

| | | |
|---|---|---|
| Headlight | 1 | |
| illumination apparatus | 2; 44 | |
| housing | 4 | |
| main section | 6 | |
| housing section | 8 | |
| phosphor | 10 | |
| crack detector | 12 | |
| flexible printed circuit board | 14; 52 | |
| contact pins | 16, 18; 46, 48 | |
| stiff printed circuit board | 20 | |
| printed circuit board section | 22 | |
| cladding | 24; 50 | |
| main body | 26 | |
| housing head | 28 | |
| section | 30 | |
| support surface | 32, 34 | |
| slot | 36 | |
| stop | 38 | |
| substrate | 40 | |
| stop | 42 | |
| end section | 54 | |
| groove | 56 | |

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An illumination apparatus, comprising:
a housing, in which at least one radiation source is fixed;
wherein a phosphor that is fastened to the housing is arranged downstream of the radiation source, said phosphor being connected to a crack detector, which is used for crack monitoring of the phosphor;
wherein a signal path is provided, said signal path connecting the crack detector to an evaluation unit that is fixed to the housing, the evaluation unit being disposed on a first circuit board, wherein the signal path is formed by at least two contact pins and a flexible printed circuit board that is connected to the crack detector; and wherein the at least two contact pins extend between and electrically interconnect the first circuit board and the flexible printed circuit board, the at least two contact pins retaining the flexible printed circuit board in spaced relation away from the first circuit board.

2. The illumination apparatus of claim 1,
wherein the contact pins are sheathed by electrically insulating cladding and arranged within the housing.

3. The illumination apparatus of claim 1,
wherein the first circuit board comprises a stiff printed circuit board, to which the contact pins are fixedly connected.

4. The illumination apparatus of claim 1,
wherein a slot for receiving the contact pins is formed within the housing.

5. The illumination apparatus of claim 2,
wherein at least one support surface or at least two support surfaces is/are formed at the cladding, the contact pins being supportable thereby on the housing in one or two directions.

6. The illumination apparatus of claim 1,
wherein at least one of the contact pins has a technical coating.

7. The illumination apparatus of claim 3,
wherein the contact pins are at least one of soldered or adhesively bonded to the flexible printed circuit board or soldered or adhesively bonded to the stiff printed circuit board.

8. The illumination apparatus of claim 1,
wherein the crack detector has at least one conductive track, which is arranged on an input coupling side or an output coupling side of the phosphor or within the phosphor.

9. The illumination apparatus of claim 1,
wherein at least one contact pin or the contact pins have at least one offset.

10. The illumination apparatus of claim 9,
wherein the contact pins are offset in the direction of the flexible printed circuit board.

11. A headlamp, comprising:
an illumination apparatus, comprising:
a housing, in which at least one radiation source is fixed;
wherein a phosphor that is fastened to the housing is arranged downstream of the radiation source, said phosphor being connected to a crack detector, which is used for crack monitoring of the phosphor;
wherein a signal path is provided, said signal path connecting the crack detector to an evaluation unit that is fixed to the housing, the evaluation unit being disposed on a first circuit board, wherein the signal path is formed by at least two contact pins and a flexible printed circuit board that is connected to the crack detector; and wherein the at least two contact pins extend between and electrically interconnect the first circuit board and the flexible printed circuit board, the at least two contact pins retaining the flexible printed circuit board in spaced relation away from the first circuit board.

* * * * *